(12) United States Patent
Nakagawa

(10) Patent No.: US 9,892,945 B2
(45) Date of Patent: Feb. 13, 2018

(54) COMPOSITE SEAL

(71) Applicant: NIPPON VALQUA INDUSTRIES, LTD., Tokyo (JP)

(72) Inventor: Ippei Nakagawa, Gojo (JP)

(73) Assignee: NIPPON VALQUA INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/433,306

(22) PCT Filed: Sep. 25, 2013

(86) PCT No.: PCT/JP2013/075861
§ 371 (c)(1),
(2) Date: Apr. 2, 2015

(87) PCT Pub. No.: WO2014/057803
PCT Pub. Date: Apr. 17, 2014

(65) Prior Publication Data
US 2015/0279706 A1 Oct. 1, 2015

(30) Foreign Application Priority Data
Oct. 9, 2012 (JP) .................................. 2012-224158

(51) Int. Cl.
*H01L 23/10* (2006.01)
*F16J 15/12* (2006.01)
(Continued)

(52) U.S. Cl.
CPC ........ *H01L 21/67126* (2013.01); *F16J 15/08* (2013.01); *F16J 15/104* (2013.01);
(Continued)

(58) Field of Classification Search
CPC .......... F16J 15/022; F16J 15/104; F16J 15/12; F16J 15/121; F16J 15/122; F16J 15/127; F16J 15/128; H01L 21/67126; H01L 23/10
See application file for complete search history.

(56) References Cited

U.S. PATENT DOCUMENTS 25,724 A * 10/1859 Colvin .................... F16J 15/128
277/653
3,584,889 A * 6/1971 Sheets .................... F16J 15/022
277/625
(Continued)

FOREIGN PATENT DOCUMENTS

JP     08-193659     7/1996
JP     11-201288     7/1999
(Continued)

OTHER PUBLICATIONS

DE 10 2008 0111592 Machine Translation.*
(Continued)

*Primary Examiner* — Nicholas L Foster
(74) *Attorney, Agent, or Firm* — Westerman, Hattori, Daniels & Adrian, LLP

(57) ABSTRACT

The composite seal includes a metal member arranged on a first substrate side and an elastic member arranged on a second device side and capable of elastic deformation. The composite seal having a structure capable of suppressing degradation even with ultraviolet radiation is thus provided.

5 Claims, 10 Drawing Sheets

(51) Int. Cl.
*F16J 15/10* (2006.01)
*F16J 15/02* (2006.01)
*H01L 21/67* (2006.01)
*F16J 15/08* (2006.01)

(52) U.S. Cl.
CPC ............ *F16J 15/12* (2013.01); *F16J 15/128* (2013.01); *H01L 23/10* (2013.01); *F16J 15/022* (2013.01)

(56) References Cited

U.S. PATENT DOCUMENTS

| | | | | |
|---|---|---|---|---|
| 4,383,694 | A * | 5/1983 | Fontana | F16J 15/12 277/650 |
| 5,172,921 | A * | 12/1992 | Stenlund | F16J 15/32 277/300 |
| 5,538,262 | A * | 7/1996 | Matsumura | F16J 15/128 277/608 |
| 5,735,529 | A * | 4/1998 | Lawrence | F16J 15/123 277/596 |
| 6,827,353 | B2 * | 12/2004 | Fonville | F16J 15/061 277/598 |
| 7,866,669 | B2 * | 1/2011 | Kobayashi | F16J 15/062 277/584 |
| 7,896,354 | B2 * | 3/2011 | Muramatsu | F16J 15/062 277/584 |
| 8,181,972 | B2 * | 5/2012 | Tsuji | F16K 51/02 277/641 |
| 8,608,856 | B2 * | 12/2013 | Hayashi | F16J 15/104 118/733 |
| 8,623,145 | B2 * | 1/2014 | Bowman | F16J 15/062 118/733 |
| 8,906,747 | B2 * | 12/2014 | Hooper | B81B 7/0064 257/678 |
| D754,308 | S * | 4/2016 | Nakagawa | D23/269 |
| 2003/0010515 | A1 * | 1/2003 | Botrie | C08G 18/48 174/32 |
| 2005/0263878 | A1 | 12/2005 | Potter | B81C 1/00269 257/704 |
| 2007/0024009 | A1 * | 2/2007 | Rosenquist | F16J 15/062 277/592 |
| 2007/0075503 | A1 * | 4/2007 | Hayashi | F16J 15/104 277/589 |
| 2008/0018058 | A1 | 1/2008 | Kobayashi et al. | |
| 2008/0157486 | A1 | 7/2008 | Kuzawa et al. | |
| 2009/0174152 | A1 * | 7/2009 | Muramatsu | F16J 15/062 277/562 |
| 2010/0072707 | A1 * | 3/2010 | Haynes | E21B 33/03 277/312 |
| 2011/0227295 | A1 * | 9/2011 | Watanabe | F02F 11/002 277/591 |
| 2011/0232843 | A1 | 9/2011 | Bowman et al. | |
| 2013/0313700 | A1 * | 11/2013 | Hooper | B81L 37/0064 257/704 |
| 2014/0030633 | A1 * | 1/2014 | Palermo | F16J 15/128 429/510 |
| 2014/0060811 | A1 * | 3/2014 | Mazyar | E21B 49/082 166/118 |
| 2014/0117629 | A1 * | 5/2014 | Biallas | C23C 14/20 277/653 |
| 2014/0216636 | A1 | 8/2014 | Kuzawa et al. | |

FOREIGN PATENT DOCUMENTS

| | | |
|---|---|---|
| JP | 03-297124 B2 | 7/2002 |
| JP | 2005-164027 | 6/2005 |
| JP | 2006-71025 | 3/2006 |
| JP | 2007-120738 | 5/2007 |
| JP | 2007-170634 | 7/2007 |
| JP | 2008-25720 | 2/2008 |
| JP | 2008-164079 | 7/2008 |
| JP | 2008-298261 | 12/2008 |
| JP | 2003-343727 | 12/2013 |
| TW | 201145427 A1 | 12/2011 |
| WO | 2009/038022 A1 | 3/2009 |

OTHER PUBLICATIONS

JP 2008-25720 Machine Translation.*
Machine Translation of JP H03297124.*
International Search Report for PCT/JP2013/075861, dated Nov. 12, 2013, and English translation thereof.
Office Action dated Mar. 22, 2016, issued in counterpart Japanese Application No. 2014-540795, with English translation (4 pages).
Office Action dated Feb. 20, 2017, issued in counterpart Taiwanese Patent Application No. 102136385, with English translation. (7 pages).

* cited by examiner

COMPOSITE SEAL

TECHNICAL FIELD

The present invention relates to a structure of a composite seal for use, for example, in semiconductor manufacturing equipment.

BACKGROUND ART

For example, in semiconductor manufacturing equipment, a seal member (gasket) as disclosed in PTD 1 to 6 is used when a region where a semiconductor substrate is placed the other region are hermetically separated from each other in order to install the semiconductor substrate in a vacuum atmosphere.

CITATION LIST

Patent Document

PTD 1: Japanese Patent Application Laid-Open No. 08-193659
PTD 2: Japanese Patent Application Laid-Open No. 11-201288
PTD 3: Japanese Patent Application Laid-Open No. 2003-343727
PTD 4: Japanese Patent Application Laid-Open No. 2007-120738
PTD 5: Japanese Patent Application Laid-Open No. 2007-170634
PTD 6: Japanese Patent Application Laid-Open No. 2008-164079

SUMMARY OF INVENTION

Technical Problem

In recent years, in a manufacturing process of semiconductor manufacturing equipment, ultraviolet rays have been used. When ultraviolet rays are used, a region where a semiconductor substrate is placed and the other region are hermetically separated from each other using a plate-shaped quartz member for permitting passage of ultraviolet rays. The seal member mentioned above is used also in this case.

However, ultraviolet rays diffusively reflected in the inside of the quartz member reach the seal member located on the periphery, and the ultraviolet radiation to the seal member may significantly degrade the seal member.

The present invention is made in view of the technical problem above and aims to provide a composite seal having a structure capable of suppressing degradation of the composite seal even when irradiated with ultraviolet rays.

Solution to Problem

A composite seal according to the present invention is used in semiconductor manufacturing equipment including a first device in which a substrate is arranged and a plate-like second device arranged to face the first device to allow passage of ultraviolet rays. The composite seal is arranged so as to surround a periphery of the substrate and held between the first device and the second device to be elastically deformed to hermetically separate space on one surface side of the second device from a space on the other surface side. The composite seal includes a metal member arranged on the first device side and an elastic member arranged on the second device side and capable of elastic deformation.

In another embodiment, the elastic member includes a main body and a flange portion extending outward from the main body. The metal member is provided so as to cover a region on an opposite side to the main body with the flange portion interposed.

In another embodiment, the main body has an approximately trapezoidal shape in cross section with a short side on the first device side and a long side on the second device side.

In another embodiment, the main body has a curved shape in cross section that protrudes toward the first device.

In another embodiment, an end surface of the flange portion has a slope shape that increases in thickness as approaching the main body.

In another embodiment, the end surface of the flange portion is a slope that has an outermost side located on the second device side and is inclined inward from the second device side toward the first device side.

In another embodiment, the end surface of the flange portion is a slope that has an outermost side located on the first device side and is inclined inward from the first device side toward the second device side.

In another embodiment, the elastic member is a rubber-like member. The metal member is a thin-film aluminum member.

In another embodiment, the first device includes a groove provided so as to surround a periphery of a substrate arrangement region in which the substrate is arranged. The composite seal has an annular form and is accommodated in the groove.

Advantageous Effects of Invention

The present invention provides a composite seal having a structure capable of suppressing degradation even with ultraviolet radiation.

DESCRIPTION OF EMBODIMENTS

Figure 1:
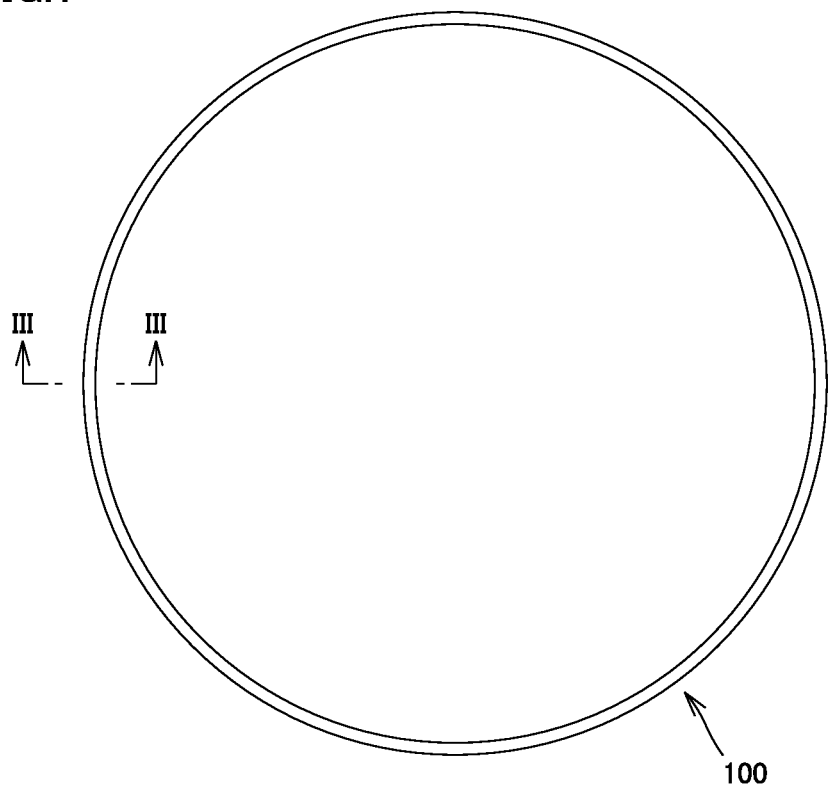
FIG. 1 is a plan view showing a structure of a composite seal in a first embodiment.

A composite seal in each embodiment based on the present invention will be described below with reference to the drawings. The scope of the present invention is not necessarily limited to the number and amount mentioned, if any, in the embodiments described below, unless otherwise specified. The same or corresponding parts are denoted with the same reference numerals and an overlapping description may not be repeated.

(First Embodiment: Composite Seal 100)

Figure 2:
FIG. 2 is a side view showing a structure of the composite seal in the first embodiment.
Figure 3:
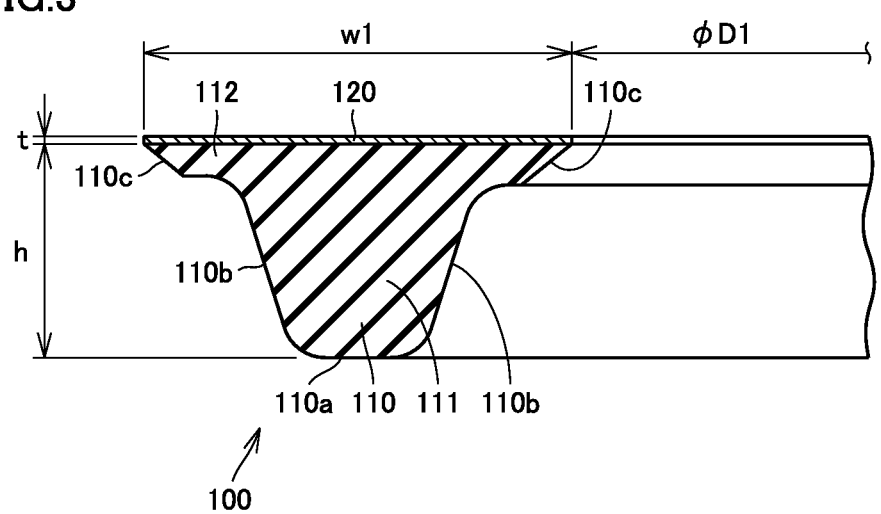
FIG. 3 is a cross-sectional view as viewed from the arrow in FIG. 1.

Referring to FIG. 1 to FIG. 3, a structure of a composite seal 100 in the present embodiment will be described. FIG. 1 is a plan view showing a structure of the composite seal 100, FIG. 2 is a side view showing a structure of the composite seal 100, and FIG. 3 is a cross-sectional view as viewed from the arrow in FIG. 1.

Referring to FIG. 1 to FIG. 3, the composite seal 100 in the present embodiment has an annular form. The size of the composite seal 100 is appropriately determined depending on the size of semiconductor manufacturing equipment being used. For example, the inner diameter (φD1) is about 360 mm, the width (w1) is about 6 mm, and the height (h) is about 3 mm.

As shown in FIG. 3, a specific structure of the composite seal 100 includes an elastic member 110 capable of elastic deformation and a metal member 120. The elastic member 110 is formed with a rubber-like member, for example, a fluoro rubber member (vinylidene fluoride (FKM)). In the present embodiment, SPOQ ARMOR (registered trademark) manufactured by NIPPON VALQUA INDUSTRIES, LTD. is used as the elastic member 110. An aluminum sheet having a thickness of about 0.05 mm is used as the metal member 120. The metal member 120 is preferably a material that suppresses passage of ultraviolet rays and prevents ultraviolet rays from reaching the elastic member 110. For example, aluminum materials other than aluminum, such as an aluminum alloy and aluminized steel can be used.

In a cross-sectional view of a groove 13 (see FIG. 4) provided in semiconductor manufacturing equipment described later, the elastic member 110 includes a main body 111 accommodated in the inside of the groove 13 and a flange portion 112 not accommodated in the inside of the groove 13 but exposed from the groove 13 and extending outward from the main body 111. Here, extending outward from the main body 111 means that the flange portion 112 overhangs inward and outward in the radial direction of the composite seal 100 as shown in FIG. 3. The same is applicable to the embodiments below.

The metal member 120 is provided so as to cover a region on the opposite side to the main body 111 with the flange portion 112 interposed.

The main body 111 has an approximately trapezoidal shape in cross section with a short side on the groove 13 side (the lower side in FIG. 3) and a long side on the metal member 120 side and has a short side portion 110a and angled side surface portions 110b, 110b.

An end surface 110c of the flange portion 112 has a slope shape that increases in thickness as approaching the main body 111. Specifically, the end surface 110c is a slope that has an outermost side located on the second device 21 side described later (the upper side in FIG. 3) and is inclined inward from the second device 21 side (the upper side in FIG. 3) toward the first device 11 side (the lower side in FIG. 3).

(Use State of Composite Seal 100)

Figure 4:
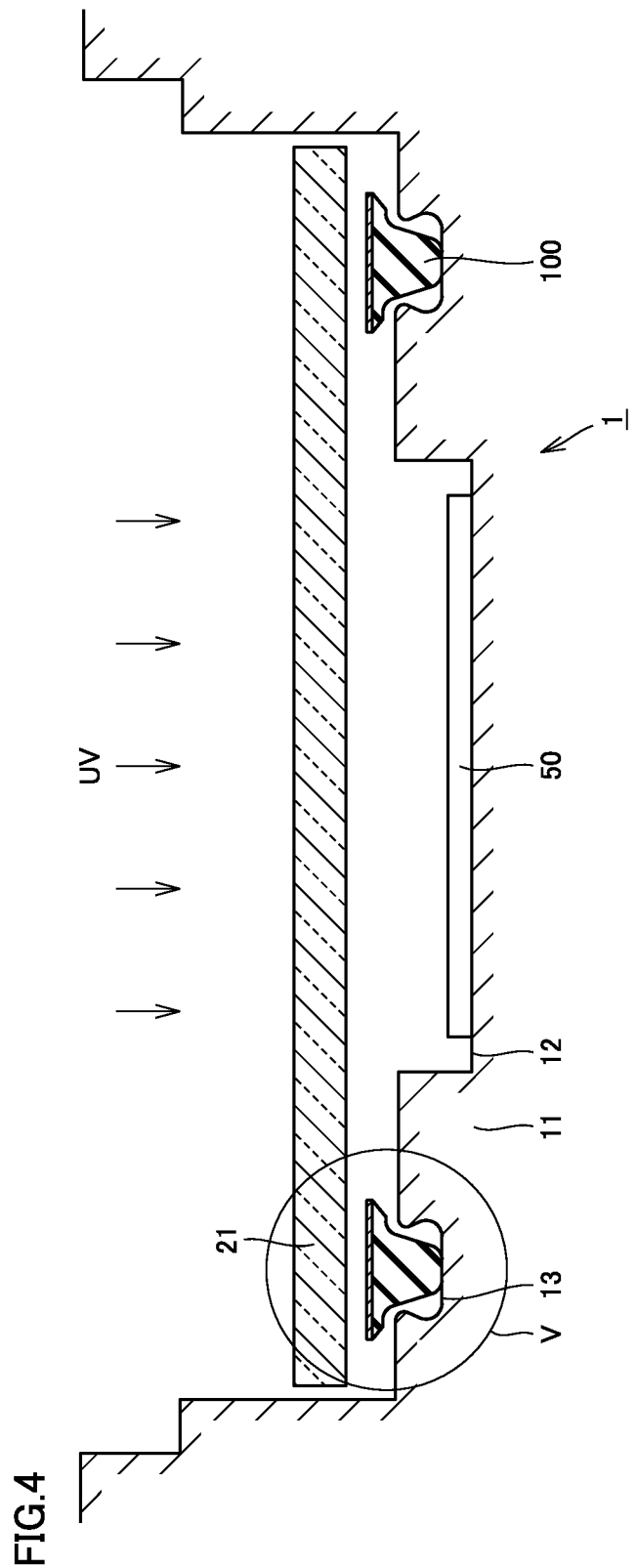
FIG. 4 is a cross-sectional view of semiconductor manufacturing equipment showing a use state of the composite seal in the first embodiment.
Figure 5:
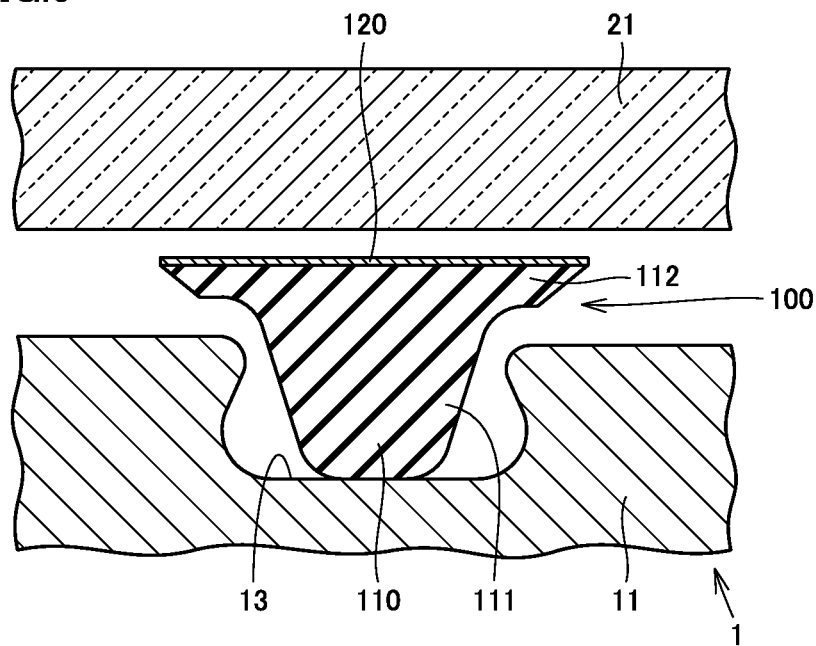
FIG. 5 is a first cross-sectional view showing a deformation state (before deformation) of the composite seal in the first embodiment.
Figure 6:
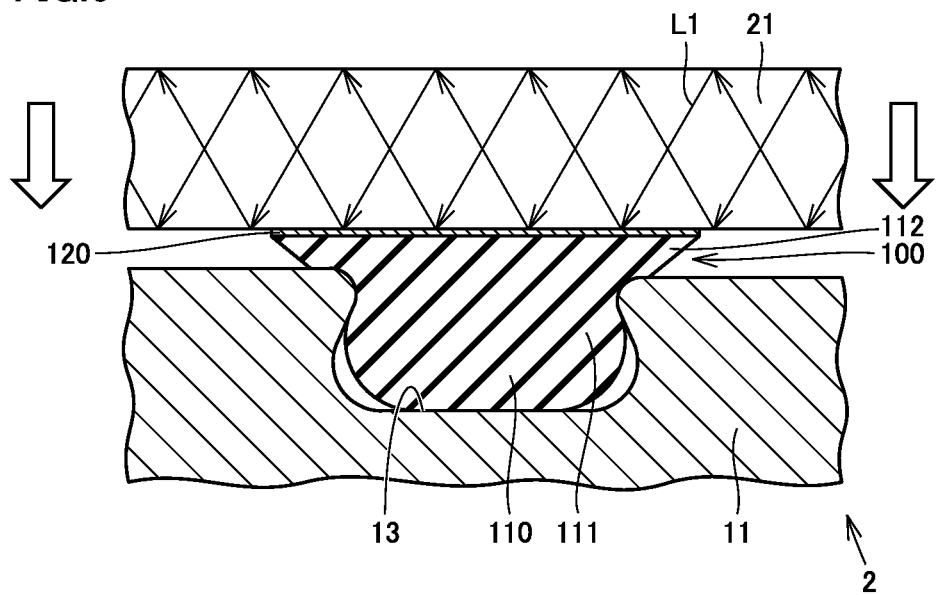
FIG. 6 is a second cross-sectional view showing a deformation state (after deformation) of the composite seal in the first embodiment.

Referring now to FIG. 4 to FIG. 6, a use state of the composite seal 100 will be described. FIG. 4 is a cross-sectional view of semiconductor manufacturing equipment showing a use state of the composite seal 100. FIG. 5 is a first cross-sectional view showing a deformation state (before deformation) of the composite seal 100. FIG. 6 is a second cross-sectional view showing a deformation state (after deformation) of the composite seal 100.

Referring to FIG. 4, semiconductor manufacturing equipment 1 in which the composite seal 100 is used includes a first device 11 including a groove 13 provided so as to surround the periphery of a substrate arrangement region 12 in which a semiconductor substrate 50 is arranged, and a plate-like second device 21 arranged to face the first device 11 to allow passage of ultraviolet rays. A quartz substrate is used for the plate-like second device 21. In this semiconductor manufacturing equipment 1, the groove 13 is provided in an annular form.

FIG. 5 shows a state in which the composite seal 100 is placed in the groove 13. The main body 111 of the composite seal 100 is positioned in the groove 13, and the flange portion 112 is not accommodated in the inside of the groove 13 but exposed from the groove 13. The metal member 120 is positioned on the second device 21 side of the flange portion 112.

FIG. 6 shows a state in which the semiconductor manufacturing equipment 1 is controlled such that the second device 21 is lowered toward the first device 11 and the substrate arrangement region 12 side is in a vacuum state. The composite seal 100 is held between the first device 11 and the second device 21 to be elastically deformed to a large degree, so that the space on one surface side of the second device 21 (the first device 11 side) and the space on the other surface side are hermetically separated from each other.

Here, if ultraviolet rays (UV) are applied to the semiconductor substrate 50 placed on the substrate arrangement region 12, ultraviolet rays diffusively reflected in the inside of the second device (quartz member) 21 as shown by the arrows L1 in the second device 21 in FIG. 6 reach the elastic member 110 located on the periphery, so that the elastic member 110 is radiated with ultraviolet rays.

However, with the composite seal 100 in the first embodiment, the metal member 120 significantly suppresses ultraviolet radiation to the elastic member 110, thereby preventing the progress of degradation of the elastic member 110.

During compression of the elastic member 110, as shown in FIG. 5 and FIG. 6, the elastic member 110 changes to a large degree in the inside of the groove 13, so that the elastic member 110 successfully achieves hermeticity while the deformation of the flange portion 112 is suppressed. Breakage such as cracks in the metal member 120 with poor elastic deformability thus can be prevented.

Referring now to FIG. 7 to FIG. 12, a change in internal pressure with a temperature change during compression of the composite seal 100 will be described. FIG. 7 to FIG. 12 are first to sixth cross-sectional views showing a change in internal pressure in a deformation state of the composite seal 100.

Figure 7:
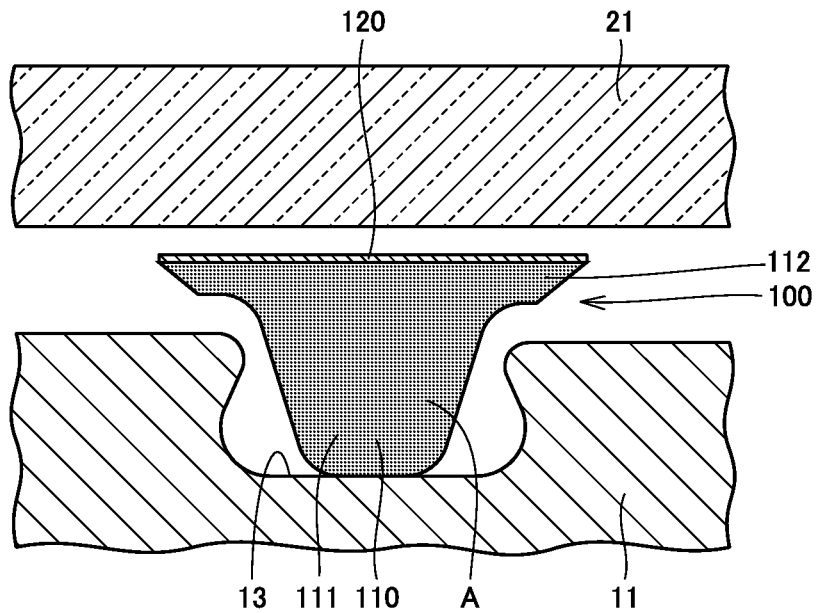
FIG. 7 is a first cross-sectional view showing a change in internal pressure in a deformation state of the composite seal in the first embodiment.
Figure 8:
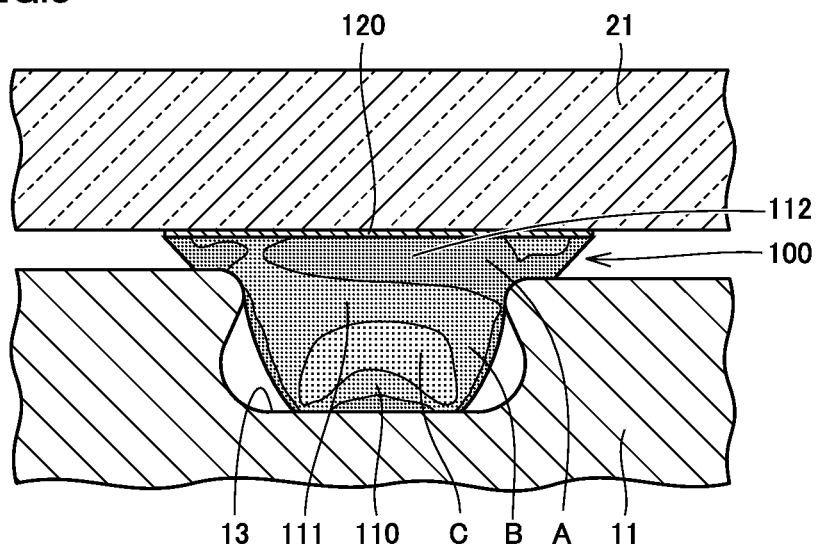
FIG. 8 is a second cross-sectional view showing a change in internal pressure in a deformation state of the composite seal in the first embodiment.

FIG. 7 shows a state at room temperature (25° C.) in which pressurizing force is not applied to the main body 111 and the flange portion 112 of the composite seal 100. No pressure is applied to region A (the entire region of the elastic member 110). FIG. 8 shows a state at room temperature (25° C.) in which pressurizing force is applied to the composite seal 100 (when the vacuum pressure is about 5 Torr). Inside the main body 111, the internal pressure rises. The internal pressure is such that region A<region B<region C. On the other hand, the change in internal pressure of the flange portion 112 is smaller than that of the main body 111.

Figure 9:
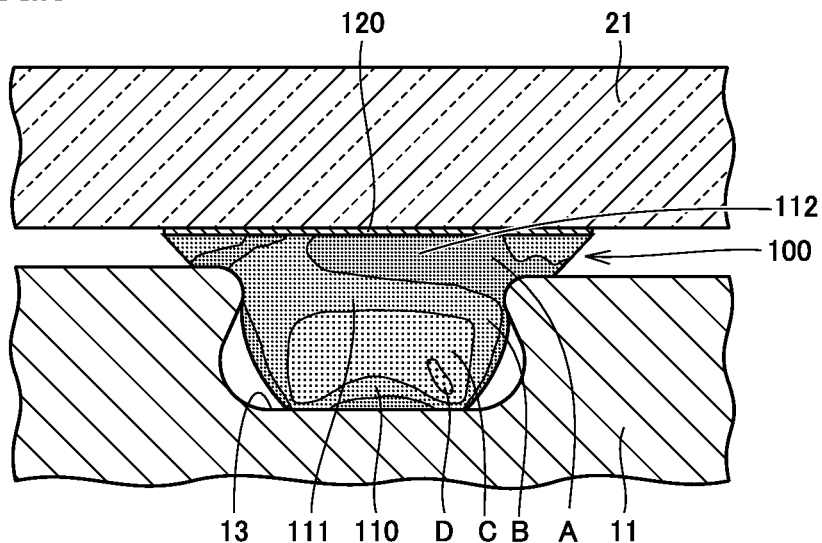
FIG. 9 is a third cross-sectional view showing a change in internal pressure in a deformation state of the composite seal in the first embodiment.

Referring to FIG. 9 to FIG. 12, the cases where the temperature of the composite seal 100 further rises will be described. FIG. 9 shows a case where the temperature is 70° C. Inside the main body 111, the internal pressure further rises. The internal pressure is such that region A<region B<region C<region D. On the other hand, the change in internal pressure of the flange portion 112 is smaller than that of the main body 111.

Figure 10:
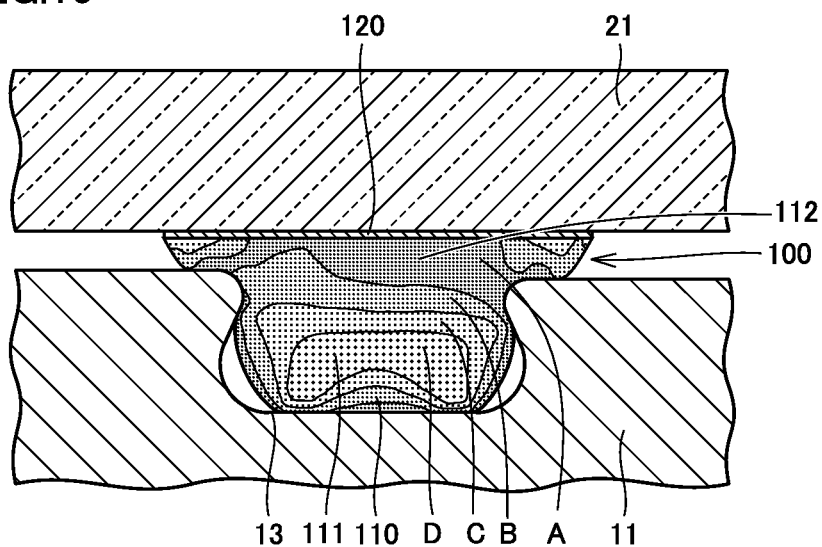
FIG. 10 is a fourth cross-sectional view showing a change in internal pressure in a deformation state of the composite seal in the first embodiment.

FIG. 10 shows a case where the temperature is 120° C. Inside the main body 111, region D expands, and the internal pressure further rises. The internal pressure is such that region A<region B<region C<region D. On the other hand, the change in internal pressure of the flange portion 112 is smaller than that of the main body 111.

Figure 11:
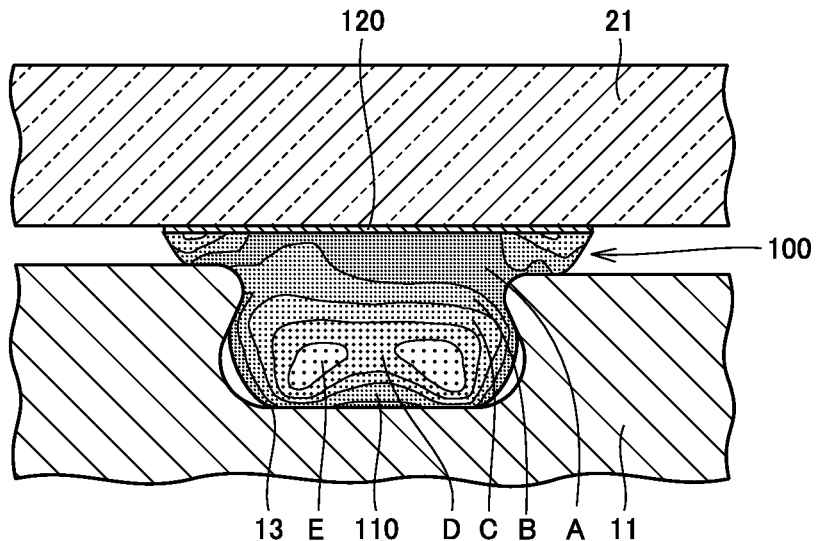
FIG. 11 is a fifth cross-sectional view showing a change in internal pressure in a deformation state of the composite seal in the first embodiment.

FIG. 11 shows a case where the temperature is 150° C. Inside the main body 111, region E having an internal pressure higher than region D is produced, and the internal pressure further rises. The internal pressure is such that region A<region B<region C<region D<region E. On the other hand, the change in internal pressure of the flange portion 112 is smaller than that of the main body 111.

Figure 12:
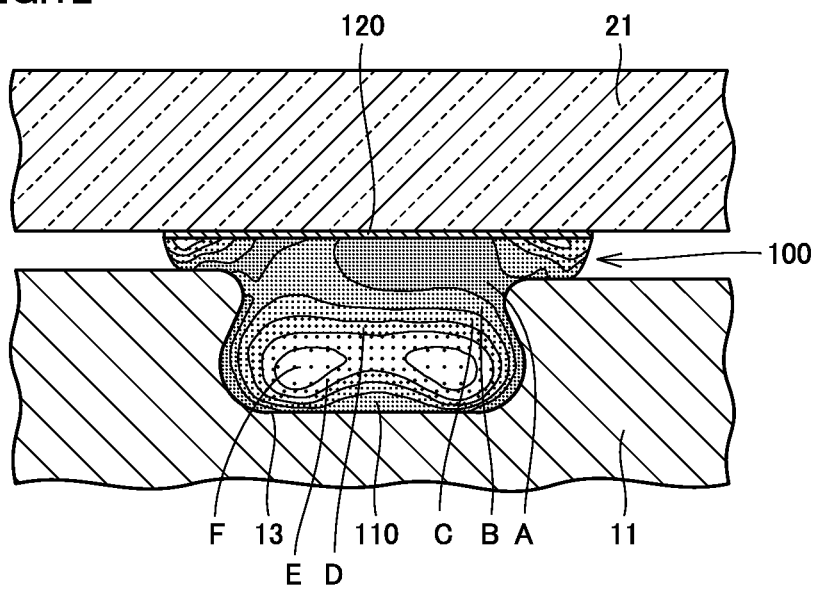
FIG. 12 is a sixth cross-sectional view showing a change in internal pressure in a deformation state of the composite seal in the first embodiment.

FIG. 12 shows a case where the temperature is 200° C. Inside the main body 111, region E expands, and region F having an internal pressure higher than region F is produced. The internal pressure further rises. The internal pressure is such that region A<region B<region C<region D<region E<region F. On the other hand, the change in internal pressure of the flange portion 112 is smaller than that of the main body 111.

As described above, based on that the deformation of the main body 111 is small even when the temperature of the composite seal 100 rises, it is confirmed that breakage such as cracks in the metal member 120 with poor elastic deformability can be prevented.

As described above, in the composite seal 100 in the present embodiment, the metal member 120 significantly suppresses ultraviolet radiation to the elastic member 110, thereby retarding the progress of degradation of the elastic member 110 by ultraviolet rays.

Since the deformation of the flange portion 112 is small during compression of the composite seal 100, breakage such as cracks in the metal member 120 with poor elastic deformability can be prevented.

(Second Embodiment: Composite Seal 200)

Figure 13:
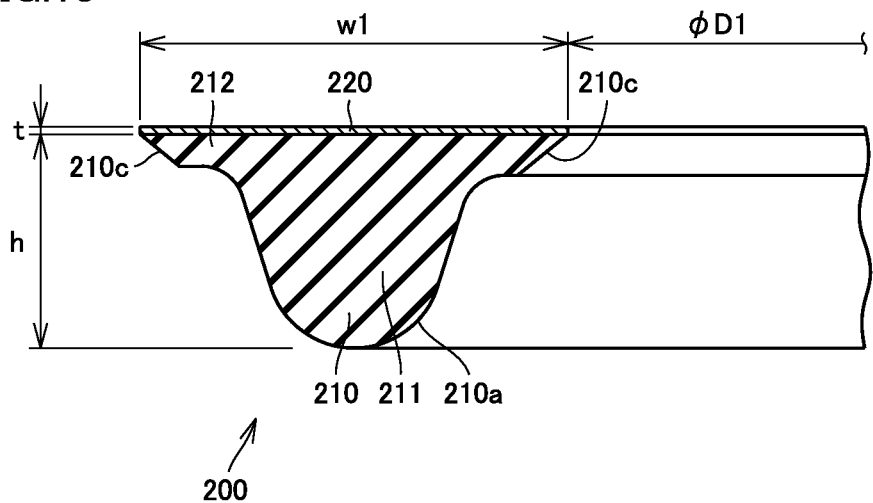
FIG. 13 is a cross-sectional view showing a structure of the composite seal in a second embodiment.

Referring to FIG. 13, a structure of a composite seal 200 in the present embodiment will be described. FIG. 13 is a cross-sectional view showing a structure of the composite seal 200.

The composite seal 200 in the present embodiment is basically configured in the same manner as the composite seal 100 in the foregoing first embodiment and has an annular form. The size of the composite seal 200 is appropriately determined depending on the size of the semiconductor manufacturing equipment being used. For example, the inner diameter (φD1) is about 360 mm, the width (w1) is about 6 mm, and the height (h) is about 3 mm.

As shown in FIG. 13, a specific structure of the composite seal 200 includes an elastic member 210 capable of elastic deformation and a metal member 220 that reflects ultraviolet rays. The materials used for the elastic member 210 and the metal member 220 are the same as in the composite seal 100 in the foregoing first embodiment.

In a cross sectional view of the groove 13 (see FIG. 4) provided in semiconductor manufacturing equipment described later, the elastic member 210 includes a main body 211 accommodated in the inside of the groove 13 and a flange portion 212 not accommodated in the inside of the groove 13 but exposed from the groove 13 and extending outward from the main body 211.

The metal member 220 is provided so as to cover a region on the opposite side to the main body 211 with the flange portion 212 interposed. The main body 211 has a curved shape 210a in cross section that protrudes toward the groove 13. An end surface 210c of the flange portion 212 is formed in the same manner as the end surface 110c of the composite seal 100 in the foregoing first embodiment.

(Use State of Composite Seal 200)

Figure 14:
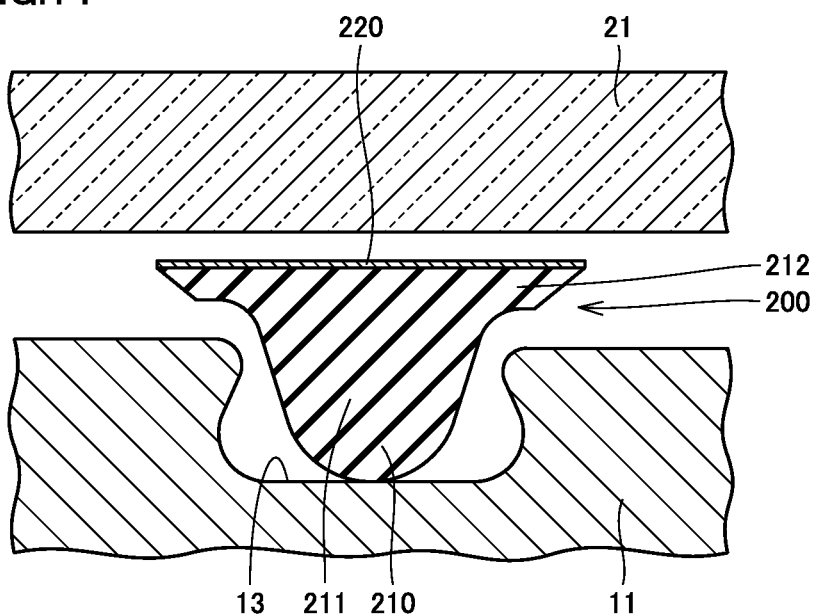
FIG. 14 is a first cross-sectional view showing a deformation state (before deformation) of the composite seal in the second embodiment.
Figure 15:
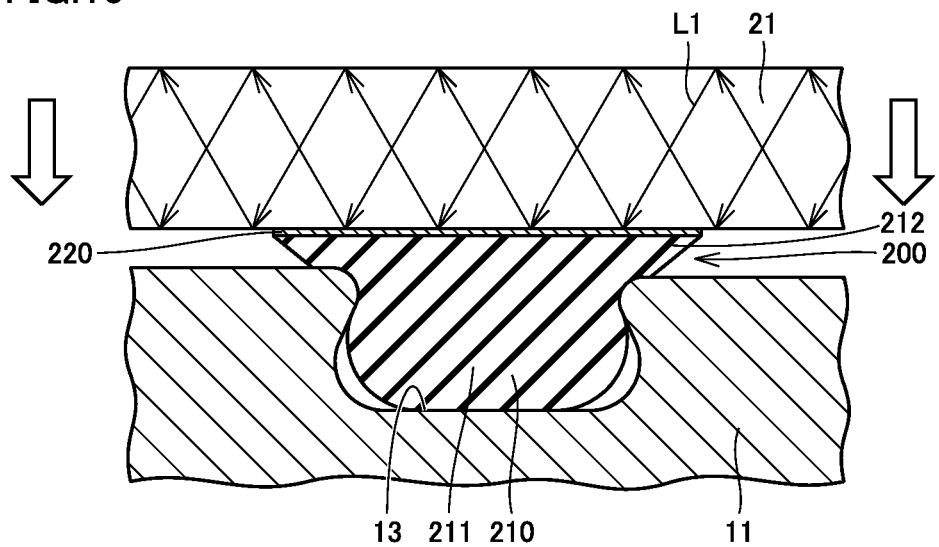
FIG. 15 is a second cross-sectional view showing a deformation state (after deformation) of the composite seal in the second embodiment.

Referring now to FIG. 14 and FIG. 15, a use state of the composite seal 200 will be described. FIG. 14 is a first cross-sectional view showing a deformation state (before deformation) of the composite seal 200. FIG. 15 is a second cross-sectional view showing a deformation state (after deformation) of the composite seal 200.

Referring to FIG. 14, the semiconductor manufacturing equipment 1 in which the composite seal 200 is used is the same as in the first embodiment. The state in which the composite seal 200 is placed in the groove 13 is shown. The main body 211 of the composite seal 200 is positioned in the groove 13, and the flange portion 212 is not accommodated in the inside of the groove 13 but exposed from the groove 23. The metal member 220 is positioned on the second device 21 side of the flange portion 212.

FIG. 15 shows a state in which the semiconductor manufacturing equipment 1 is controlled such that the second device 21 is lowered toward the first device 11 and the substrate arrangement region 12 side is in a vacuum state. The composite seal 200 is held between the first device 11 and the second device 21 to be elastically deformed to a large degree, so that the space on one surface side (the first device 11 side) of the second device 21 and the space on the other surface side are hermetically separated from each other.

With the composite seal 200 in the present embodiment, the metal member 220 significantly suppresses ultraviolet radiation to the elastic member 210 in the same manner as in the composite seal 100 in the foregoing first embodiment, thereby retarding the progress of degradation of the elastic member 210 by ultraviolet rays.

Since the deformation of the flange portion 212 is small during compression of the composite seal 200, breakage such as cracks in the metal member 220 with poor elastic deformability can be prevented.

In the case where the elastic member of the composite seal has an approximately trapezoidal shape in cross section as in the first embodiment, if the composite seal becomes slanted when being attached in the groove, the short side portion partially comes into abutment with the groove. As a result, torsion may occur in the elastic member and the contact surface pressure during compression of the composite seal may become uneven. The elastic member shaped like a protruding curve in cross section as in the present embodiment can make the contact surface pressure uniform during compression even when the composite seal is slanted, thereby enabling enhancement of sealability.

(Third Embodiment: Composite Seal 300)

Figure 16:
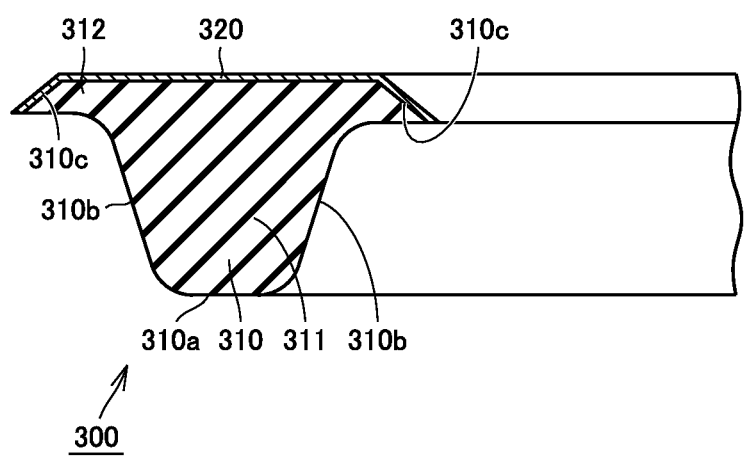
FIG. 16 is a cross-sectional view showing a structure of the composite seal in a third embodiment.

Referring to FIG. 16, a structure of a composite seal 300 in the present embodiment will be described. FIG. 16 is a cross-sectional view showing a structure of the composite seal 300.

The composite seal 300 in the present embodiment is basically configured in the same manner as the composite seal 100 in the foregoing first embodiment and has an annular form. The size of the composite seal 300 is appropriately determined depending on the size of the semiconductor manufacturing equipment being used. For example, the inner diameter (φD1) is about 360 mm, the width (w1) is about 6 mm, and the height (h) is about 3 mm.

As shown in FIG. 16, a specific structure of the composite seal 300 includes an elastic member 310 capable of elastic deformation and a metal member 320 that reflects ultraviolet rays. The materials used for the elastic member 210 and the metal member 220 are the same as in the composite seal 100 in the foregoing first embodiment.

In a cross-sectional view of the groove 13 (see FIG. 4) provided in semiconductor manufacturing equipment described later, the elastic member 310 includes a main body 311 accommodated in the inside of the groove 13 and a flange portion 212 not accommodated in the inside of the groove 13 but exposed from the groove 13 and extending outward from the main body 311.

The metal member 320 is provided so as to cover a region on the opposite side to the main body 211 with the flange portion 312 interposed. The cross-sectional shape of the main body 311 is the same as that of the main body 111 in the first embodiment. An end surface 310c of the flange portion 312 has the inverse form of the end surface 110c of the composite seal 100 in the foregoing first embodiment and is a slope that has an outermost side located on the first device 11 side and is inclined inward from the first device 11 side toward the second device 21 side.

(Use State of Composite Seal 300)

Figure 17:
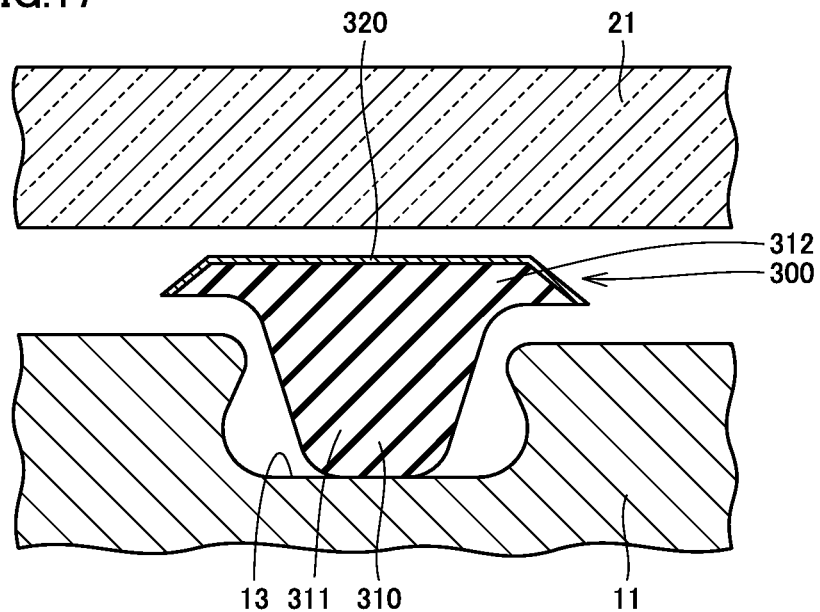
FIG. 17 is a first cross-sectional view showing a deformation state (before deformation) of the composite seal in the third embodiment.
Figure 18:
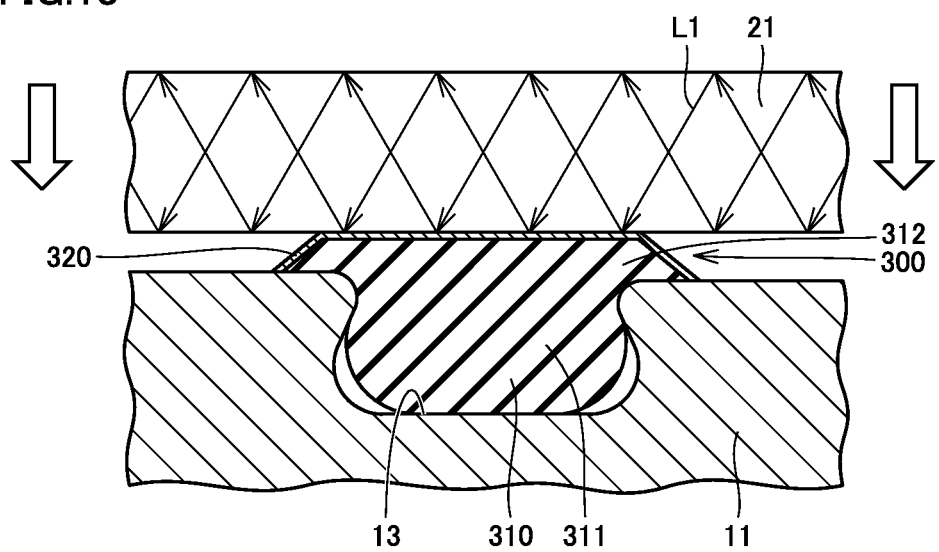
FIG. 18 is a second cross-sectional view showing a deformation state (after deformation) of the composite seal in the third embodiment.

Referring now to FIG. 17 and FIG. 18, a use state of the composite seal 300 will be described. FIG. 17 is a first cross-sectional view showing a deformation state (before deformation) of the composite seal 300. FIG. 18 is a second cross-sectional view showing a deformation state (after deformation) of the composite seal 300.

Referring to FIG. 17, the semiconductor manufacturing equipment 1 in which the composite seal 300 is used is the same as in the first embodiment. The state in which the composite seal 300 is placed in the groove 13 is shown. The main body 311 of the composite seal 300 is positioned in the groove 13, and the flange portion 312 is not accommodated in the inside of the groove 13 but exposed from the groove 23. The metal member 320 is positioned on the second device 21 side of the flange portion 312.

FIG. 18 shows a state in which the semiconductor manufacturing equipment 1 is controlled such that the second device 21 is lowered toward the first device 11 and the substrate arrangement region 12 side is in a vacuum state. The composite seal 200 is held between the first device 11 and the second device 21 to be elastically deformed to a large degree, so that the space on one surface side (the first device 11 side) of the second device 21 and the space on the other surface side are hermetically separated from each other.

With the composite seal 300 in the present embodiment, the metal member 320 significantly suppresses ultraviolet radiation to the elastic member 310 in the same manner as in the composite seal 100 in the foregoing first embodiment, thereby retarding the progress of degradation of the elastic member 310 by ultraviolet rays.

Since the deformation of the flange portion 312 is small during compression of the composite seal 300, breakage such as cracks in the metal member 320 with poor elastic deformability can be prevented.

In an environment in which ultraviolet rays intrude not only into the second device (quartz member) 21 but also into between the first device 11 and the second device 21, the provision of the metal member 320 additionally on the end surface 310c as in the present embodiment can cut off ultraviolet rays intruding from between the second device 21 and the first device 11 as shown in FIG. 18.

In the embodiments above, the composite seal is arranged in semiconductor manufacturing equipment having the groove 13. The present invention, however, can be applied similarly to semiconductor manufacturing equipment not having the groove 13.

In the embodiments described above, the elastic member of the composite seal has a structure including a main body accommodated in the inside of the groove 13 and a flange portion not accommodated in the inside of the groove 13 but exposed from the groove 13 and extending outward from the main body. However, embodiments are not limited to this structure, and a structure without a flange portion may be employed. As long as the composite seal includes the elastic member 110 arranged on the groove 13 side and capable of elastic deformation and the metal member 120 arranged on the second device 21 side to reflect ultraviolet rays, degradation of the composite seal can be suppressed even when ultraviolet rays are applied.

In the description above, the metal member reflects ultraviolet rays to suppress ultraviolet radiation to the elastic member, thereby retarding the progress of degradation of the elastic member by ultraviolet rays. The metal member may not necessarily reflect ultraviolet rays 100% and may be any metal member that can suppress ultraviolet radiation to the elastic member.

In the embodiments above, a circular annular form is employed as the shape of the composite seal. However, the annular form is not limited to a circular shape, and an oval or square annular form may be employed.

Semiconductor used in the semiconductor manufacturing equipment in which the composite seal depicted in the foregoing embodiments based on the present invention is used refers to semiconductor to which a semiconductor manufacturing process can be employed, such as a semiconductor substrate having elements embedded therein and a semiconductor substrate that forms an FPD (flat panel display).

The embodiment disclosed here should be understood as being illustrative rather than being limitative in all respects. The scope of the present invention is shown not in the foregoing description but in the claims, and it is intended that all modifications that come within the meaning and range of equivalence to the claims are embraced here.

REFERENCE SIGNS LIST 11 first device, 13 groove, 21 second device, 100, 200, 300 composite seal, 110, 210, 310 elastic member, 110a short side portion, 110b angled side surface portion, 110c, 210c, 310c end surface, 111, 211, 311 main body, 112, 212, 312 flange portion, 120, 220, 320 metal member, 210a curved shape.

The invention claimed is:

1. A semiconductor manufacturing equipment including a composite seal, a first device in which a substrate is arranged and a plate-like second device arranged to face the first device to allow passage of ultraviolet rays, the composite seal being arranged so as to surround a periphery of the substrate and held between the first device and the second device to be elastically deformed to hermetically separate a space on one surface side of the second device from a space on an other side surface, the composite seal comprising:

a metal member arranged on a side of the composite seal facing the second device; and an elastic member arranged on a side of the composite seal facing the first device and capable of elastic deformation, wherein the metal member is in a flat, plate-like shape, and the elastic member includes a main body and a flange portion above the main body and extending outward from the main body, the main body is at least partially disposed in a groove in the first device and the flange portion is outside of said groove when the composite seal is compressed between the first and second devices, wherein the metal member is provided so as to cover a region on an opposite side to the main body with the flange portion interposed therebetween, wherein an end surface of the flange portion is a slope that has an outermost side located on a side facing the second device and is inclined inward from the side facing the second device toward a side facing the first device, and wherein the metal member is on top of the flange portion, is outside of the groove, and significantly suppresses ultraviolet radiation from reaching the elastic member, thereby retarding degradation of the elastic member by ultraviolet rays.

2. The semiconductor manufacturing equipment according to claim 1, wherein the main body has an approximately trapezoidal shape in cross section with a short side on a side facing the first device and a long side on a side facing the second device.

3. The semiconductor manufacturing equipment according to claim 1, wherein the main body has a curved shape in cross section that protrudes toward the first device.

4. The semiconductor manufacturing equipment according to claim 1, wherein
the elastic member is a rubber-like member, and
the metal member is a thin-film aluminum member.

5. The semiconductor manufacturing equipment according to claim 1, wherein
the first device includes a groove provided so as to surround a periphery of a substrate arrangement region in which the substrate is arranged, and
the composite seal has an annular form and is accommodated in the groove.

* * * * *